United States Patent [19]

Goldberg

[11] Patent Number: 4,725,490

[45] Date of Patent: Feb. 16, 1988

[54] HIGH MAGNETIC PERMEABILITY COMPOSITES CONTAINING FIBERS WITH FERRITE FILL

[75] Inventor: Harris A. Goldberg, Colonia, N.J.

[73] Assignee: Hoechst Celanese Corporation, Somerville, N.J.

[21] Appl. No.: 859,292

[22] Filed: May 5, 1986

[51] Int. Cl.[4] ..................... B65D 45/00; H01Q 15/24; H01Q 17/00; H03C 7/00; H05K 9/00

[52] U.S. Cl. ..................................... 428/292; 244/121; 244/133; 252/62.54; 252/62.56; 252/62.62; 252/62.63; 252/62.64; 333/21 A; 333/21 R; 342/1; 342/2; 342/3; 342/5; 342/6; 343/756; 343/897; 343/909; 428/293; 428/294; 428/302; 428/329; 428/697; 428/701

[58] Field of Search ........................... 342/1, 2, 3, 5, 6; 343/756, 897, 909; 428/292, 293, 294, 302, 329, 697, 701

[56] References Cited

U.S. PATENT DOCUMENTS

| | | | |
|---|---|---|---|
| 2,293,839 | 8/1942 | Lindner | 342/1 |
| 2,418,479 | 4/1947 | Pratt et al. . | |
| 2,756,424 | 7/1956 | Lewis et al. | 342/1 |
| 2,771,602 | 11/1956 | Kuhnhold | 342/1 |
| 2,951,247 | 8/1960 | Halpern et al. | 342/1 |
| 2,977,591 | 3/1961 | Tanner | 342/1 |
| 2,992,425 | 7/1961 | Pratt | 342/1 |
| 2,992,426 | 7/1961 | Borcherdt | 342/1 |
| 3,047,860 | 7/1962 | Swallow et al. | 342/5 |
| 3,508,265 | 4/1970 | Ellis | 342/1 |
| 3,526,896 | 9/1970 | Wesch | 342/1 |
| 3,599,210 | 8/1971 | Stander | 342/2 |
| 3,721,982 | 3/1973 | Wesch | 342/1 |
| 3,773,684 | 11/1973 | Marks | 342/2 |
| 3,938,152 | 2/1976 | Grimes et al. | 342/1 |
| 4,003,840 | 1/1977 | Ishino et al. | 342/1 |
| 4,006,479 | 2/1977 | La Combe | 342/1 |
| 4,024,318 | 5/1977 | Forster et al. | 342/1 |
| 4,034,375 | 7/1977 | Wallin | 342/3 |
| 4,162,496 | 7/1979 | Downen et al. . | |
| 4,173,018 | 10/1979 | Dawson et al. | 342/1 |
| 4,538,151 | 8/1985 | Hatakeyama et al. | 342/1 |
| 4,606,848 | 8/1986 | Bond | 252/513 |

FOREIGN PATENT DOCUMENTS

| | | | |
|---|---|---|---|
| 152775 | 7/1986 | Japan | 252/513 |

OTHER PUBLICATIONS

British Intelligence Objectives Sub-Committee Final Report No. 869, Item No. 1, "Ferromagnetic Material For Radar Absorption", declassified Apr. 26, 1960.

*Primary Examiner*—James C. Cannon

[57] ABSTRACT

High magnetic permeability composites are obtained by incorporating ferrite fibers in the composites. The ferrite fibers consist of a polymer and particulate ferrite fill at a concentration above the percolation threshold for the ferrite fill in the polymer (typically greater than 30 volume percent). The aspect ratio and ferrite concentration of the fibers are selected to minimize demagnetization fields in the fibers. The fibers can be dispersed in low concentration in an unoriented fashion in the composites to impart high magnetic permeability to the composite. In other embodiments, the fibers are oriented in the composites to impart high magnetic permeability to the composite for incident radiation of a particular linear polarization.

25 Claims, 8 Drawing Figures

HIGH MAGNETIC PERMEABILITY COMPOSITES CONTAINING FIBERS WITH FERRITE FILL

RELATED APPLICATIONS

This application is related to an application entitled "Fiber Structure and Method for Obtaining Tuned Response to High Frequency Electromagnetic Radiation" naming Harris A. Goldberg and Yusuf Mohamed Faruq Marikar as inventors.

BACKGROUND OF THE DISCLOSURE

The increasing use of high frequency electromagnetic radiation in-radar and communication fields has resulted in the need for materials suitable as radiation absorbers, reflectors, filters and polarizers. Of particular interest are materials which can be impedence matched to the transmission medium and used as covers on outer layers of objects to reduce the radar reflectivity of the objects. For example, there is extensive interest in the reduction of the radar cross-section of military hardware such as aircraft, missiles, tanks and ships.

U.S. Pat. No. 4,433,068 to Long et al teaches the use of apparently amorphous polyimide microballoons with filler to improve microwave absorbing properties. Long et al state that the microwave absorption properties of polyimides can be modified and improved by the addition of from about 1 to 50 weight percent microwave absorbing material such as graphite powder, ferrites, metal-ceramic compounds such as ferro titanate or mixtures thereof. U.S. Pat. No. 4,335,180 to Traut discloses the making of a composite high dielectric microwave circuit board using particulate filler (e.g. titania), PTFE and glass fibers. The electronic properties of the board are apparently isotropic.

The disadvantage of these approaches is that a large amount of magnetic or dielectric filler must be added to the composite to raise the magnetic permeability or dielectric constant of the composite as a whole. The addition of large amounts of such fillers may increase the cost of the composites to unacceptable levels. It may also seriously degrade the mechanical, thermal or electrical properties of the composite, rendering it unsuitable for its intended use.

Accordingly, it is an object of the present invention to achieve selected values of magnetic permeability and dielectric constant in a composite while minimizing the use of magnetic and/or dielectric filler materials in the composite.

It is another object of the present invention to achieve selected values of magnetic permeability and dielectric constant in a composite while minimizing the effects on the mechanical, thermal and/or electrical properties of the composite matrix material.

It is another object of the present invention to achieve high magnetic permeability in a composite by the addition of ferrites without adversely affecting the dielectric constant or conductivity of the composite.

It is another object of the present invention to achieve high magnetic permeability in a composite for incident electromagnetic radiation of a particular frequency and polarization.

These and other objects and features will be apparent from the following written description and claims considered with the drawings herein.

SUMMARY OF THE PREFERRED EMBODIMENTS

In a first preferred embodiment, a composite material is provided having enhanced magnetic permeability. The composite material includes a non-magnetic matrix material and non-conducting fibers dispersed therein at a volume concentration of less than 30% with respect to the matrix material. The fibers have an average aspect ratio of at least 20 and include ferrite particulates at a concentration above the percolation threshold of the ferrite material. Longitudinal axes of the fibers are oriented randomly with respect to one another so that the magnetic permeability of the composite is approximately proportional to the product of the magnetic permeability of the ferrite and the volume percent of ferrite material in the composite. In a further aspect of the first preferred embodiment, the volume percent and permeability of the ferrite are selected to minimize the reflectivity of the composite to incident electromagnetic radiation. In this arrangement, the magnetic permeability of the ferrite may be between 10 and 100 in the frequency range of 100 MHz to 1000 MHz and the aspect ratio of the fibers is preferably at least 50.

In a second preferred embodiment, a composite material having reduced reflectivity to electromagnetic radiation is provided having a low density, low dielectric constant matrix and chopped, ferrite filled fiber dispersed in the matrix. The fiber has a magnetic permeability greater than its dielectric constant. Chopped, non-magnetic dielectric filled fiber is also dispersed in the matrix. In a further aspect of the second preferred embodiment, the fibers are selected so that the dielectric constant of the composite is approximately equal to the magnetic permeability of the composite at a predetermined frequency of interest.

Another preferred embodiment provides an absorber for polarized electromagnetic energy in a frequency range of about 10 MHz to about 10 GHz, the energy being incident on the absorber from free air. The absorber includes fibers at least a portion of which include a ferrite, longitudinal axes of the fibers being generally parallel and generally aligned with the magnetic field of the polarized electromagnetic energy. The fibers include a polymer and from 20 to 80 volume percent particulate ferrite fill. A further aspect of this embodiment provides non-magnetic dielectric fibers having longitudinal axes aligned generally parallel to one another, wherein the dielectric fibers are generally aligned with the electric field of the polarized electromagnetic energy. In another aspect of this embodiment, the effective dielectric constant of the absorber is approximately equal to the effective magnetic permeability of the absorber for a given frequency of polarized electromagnetic radiation.

In still another preferred embodiment of the invention, electromagnetic energy absorbing sheet material is provided in which the dielectric constant presented to incident electromagnetic radiation is approximately equal to the magnetic permeability. The sheet material includes non-conducting, ferrite containing fibers which are oriented approximately parallel to one another and non-conducting dielectric containing fibers which are oriented approximately parallel to one another. The ferrite fibers and dielectric fibers may be composited with a polymer binder. The ferrite may be a spinel corresponding to the formula $MFe_2O_4$, wherein M is manganese, iron, cobalt, nickel, copper, zinc, cadmium, magnesium, barium, strontium or any combination thereof. The dielectric fibers may include a polymer and a particulate dielectric fill having from 20 to 70% by volume of the fiber. The dielectric fill may be a ferroelectric material such as lead zirconium titanate (PZT).

DETAILED DESCRIPTION OF THE PREFERRED EMBODIMENTS

Preliminary to a discussion of embodiments and examples of the instant invention, the theoretical bases for the invention will be discussed.

The electromagnetic impedance (Z) of a material is given by:

$$Z=(\mu/\epsilon)^{\frac{1}{2}}$$

where $\mu$ is the magnetic permeability and $\epsilon$ is the electric permitivity.

Throughout this application, permeability and permitivity will be treated as measured relative to that of free space. The relative permitivity is also referred to as the dielectric constant.

The reflectivity of a thick piece of material for a wave of normal incidence is given by:

$$R=(1-Z)/(1+Z).$$

To simplify the following theoretical discussions, electromagnetic radiation waves of normal incidence will be considered. However, it is clear that the improved structures described will also be of value in controlling the reflectivity of radiation with non-normal incidence.

Figure 1:
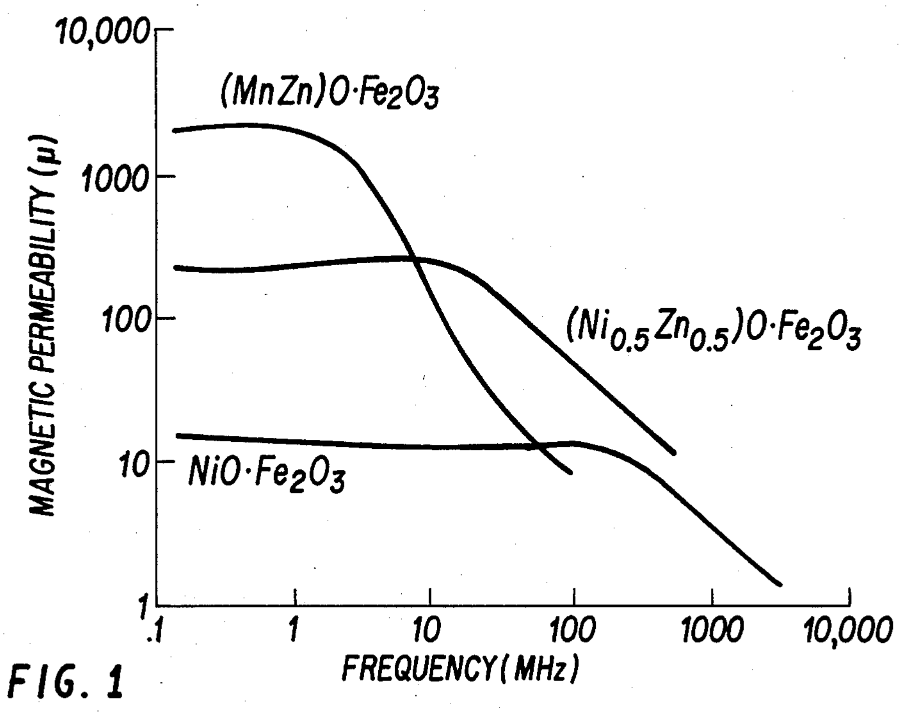
FIG. 1 is a graphical illustration of the variation of magnetic permeability with frequency for three ferrite materials.

Ferrites can be used in impedance matched structures. However, their magnetic permeability is frequency dependent and falls off rapidly above low microwave frequencies, i.e., above 10 GHz. This variation with frequency is shown in FIG. 1 for three ferrite materials: $(MnZn)O.Fe_2O3$; $(Ni_{0.5}Zn_{0.5})O.Fe_2O_3$; and $NiO.Fe_2O_3$.

In addition, the dielectric constant of such ferrite materials is often significantly higher than the magnetic permeability. This effect is most pronounced at high frequencies, primarily because the permeability is decreasing rapidly with increasing frequency, while the dielectric constant is varying less rapidly with frequency.

This disclosure relates to the use of ferrite and high dielectric constant fibers in oriented structures to make improved impedance matching for linearly polarized radiation over that which could be achieved with the ferrite alone or even by mixing the ferrite and ferroelectric material. In addition, the technique of employing ferrite and high dielectric constant materials in fiber form will lead to simpler design and fabrication of impedance matched structures, even in cases where powder mixtures could be impedance matched.

The approach which is utilized is the minimization of the demagnetizing and depolarizing fields in the fibers incorporated in the fabrics, laminates and composites discussed below. For the purposes of discussion, it is assumed that the fibers are infinitely long, although significant benefits can be achieved with fibers of a short, finite length depending on, inter alia, the aspect ratio of the fibers. However, typically, in fabrics, long individual continuous fibers may be used which extend for the entire length of the fabric.

In order to estimate the effective permeability of an oriented array of fibers (such as a fabric, laminate or composite), the contribution to the magnetic permeability will be separated into that which is due to fibers aligned with the magnetic field and that which is due to fibers oriented perpendicular to the magnetic field. For fibers arranged parallel to the magnetic field H of the incident radiation:

$$(\mu-1)_{eff}=x_{par}(\mu-1), \quad (1)$$

where x is the volume fraction in the structure of the particular fiber. For fibers arranged perpendicular to the H field of the incident radiation:

$$(\mu-1)_{eff}=x_{perp}(\mu-1)/[1+(\mu-1)/2]. \quad (2)$$

Similar results are obtained for the effective dielectric constant for the structure for fibers arranged parallel to the electric field E of the incident radiation:

$$(\epsilon-1)_{eff}=x_{par}(\epsilon-1). \quad (3)$$

For fibers perpendicular to the E field of the incident radiation:

$$(\epsilon-1)_{eff}=x_{perp}(\epsilon-1)/[1+(\epsilon-1)/2]. \quad (4)$$

A mathematical analysis of the dielectric constants of aligned rods, needles or fibers in a composite is presented in Hale, "The Physical Properties of Composite Materials," 11 *Journal of Materials Science,* pp. 2105, 2112–2113 (1976).

In order to obtain the total effective permeability and dielectric constant for the structure, the contributions from all the fibers in the structure must be added. If the fibers are positioned at an angle to the field, the field strengths can be resolved into their parallel and perpendicular components, and then added using the above equations.

Although the above analysis neglects interaction between fibers, it is expected that this will be a good approximation for most oriented structures. This is because in oriented structures with parallel fibers, even when the fibers take up 50% of the volume, the space between fibers is still equal to the thickness of the fibers themselves. Of course, as the fibers get closer together, the importance of the demagnetization effects (as given in equations (2) and (4)) will be reduced. In unoriented composites, it is expected that demagnetization effects will be important at all concentrations below the percolation threshold. The percolation threshold ($x_c$) will depend on the aspect ratio of the filler as well as the wetting of the filler by the matrix material. Since the purpose of using fibers as a filler is to reduce the demagnetization effects, fiber filler will be better than powder filler at any concentration below the percolation threshold for a powder filled composite. This is typically in the range of 15–30% by volume.

Figure 2:
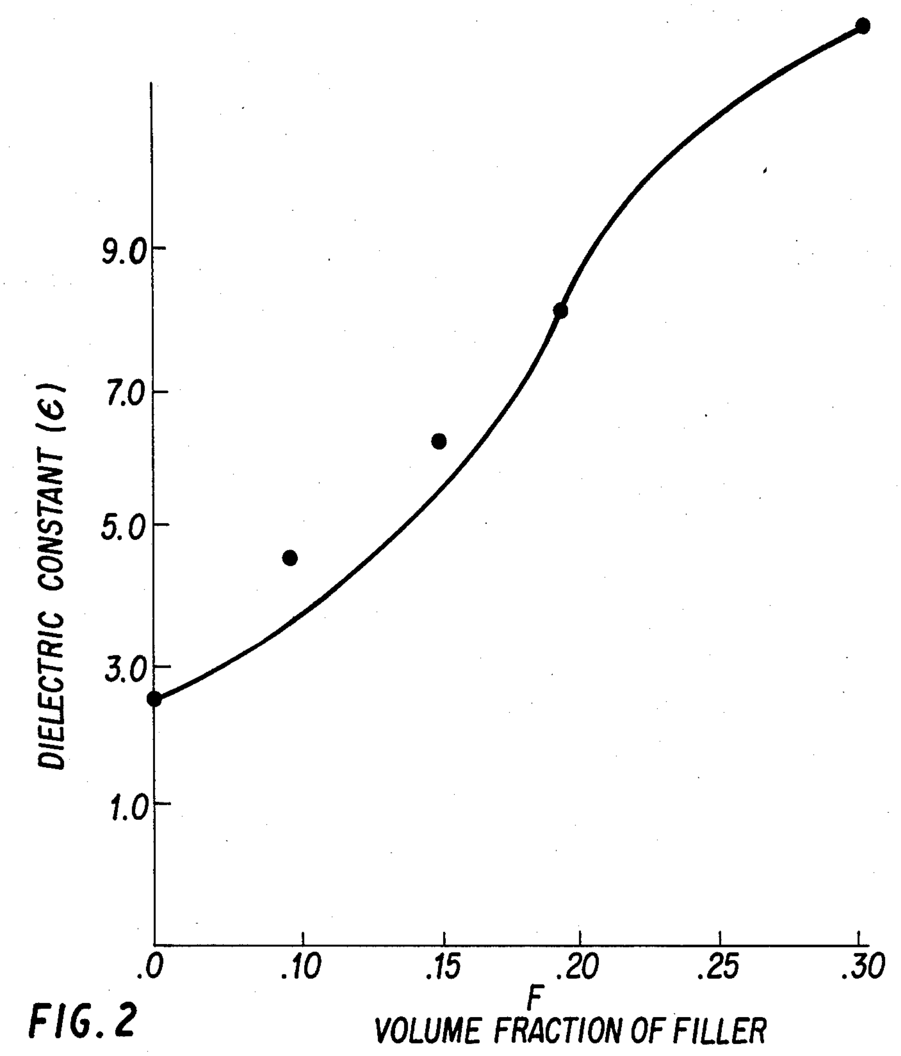
FIG. 2 is a graphical illustration of the dielectric constant of a filled epoxy as a function of the volume fraction of the filler.

This demagnetization effect is illustrated for the analogous case of the dielectric constant of a filled epoxy in FIG. 2. FIG. 2 is a graph of the dielectric constant of a PZT (lead-zirconium titanate) filled epoxy as a function of the volume fraction of the filler. The data was taken at between 2 and 18 GHz and was essentially independent of frequency. The graph suggests a diminishing return for addition of PZT material to the composite, which is attributed to a passing of the percolation threshold at which depolarization effects begin to reduce the effectiveness of the fill. An analogous effect is expected in the magnetic case when fiber volume concentration in the matrix exceeds about 30%.

Figure 3:
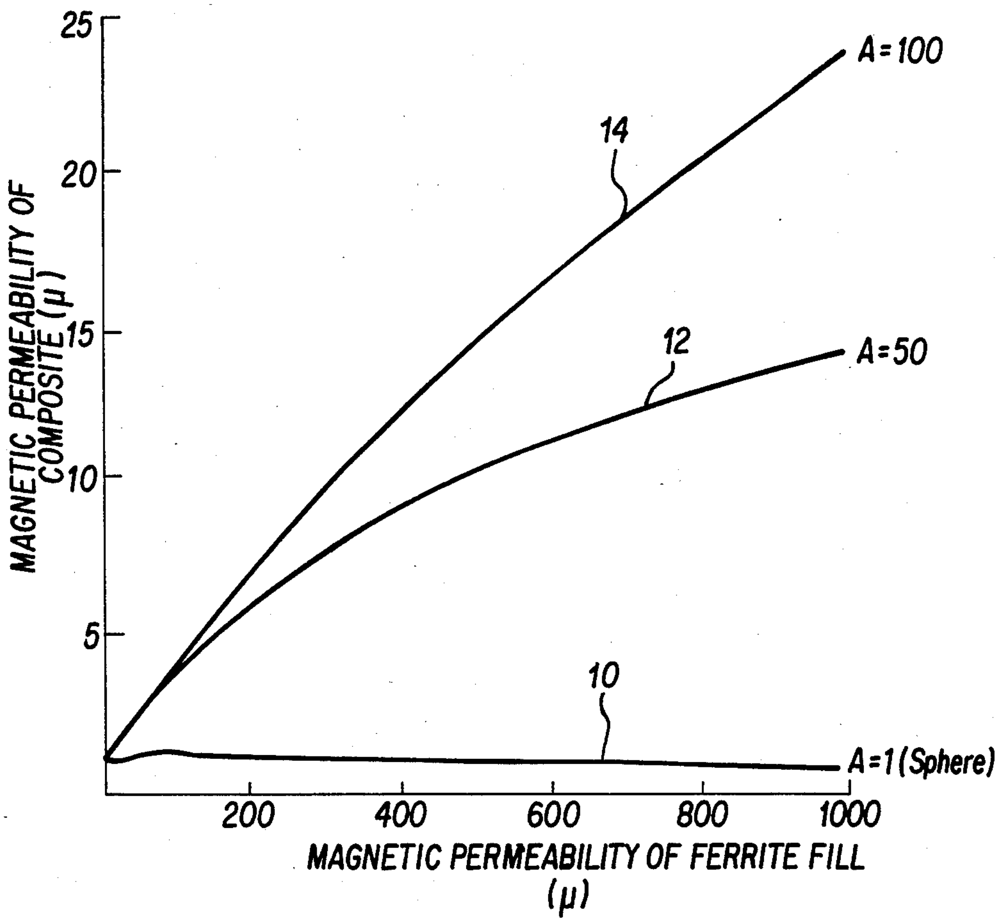
FIG. 3 is a graphical illustration of the effects of fiber aspect ratio on the magnetic permeability of a composite containing ferrite fiber fill.

It is expected that effects indicated in equations (1) and (3) are dependent on the aspect ratio of the involved fibers. The aspect ratio A of a fiber of generally circular cross-section may be expressed as $$A = l/d \tag{5}$$

where l is the length of the fiber and d is the diameter of the fiber. The expected dependency of the composite magnetic permeability on aspect ratio is depicted in FIG. 3. Three plots are shown. Plot 10 is for a composite of 10% spherical ferrite particulates dispersed in a non-magnetic composite matrix material. Plots 12 and 14 are for a composite of 10% ferrite fibers aligned in a non-magnetic composite matrix material having aspect ratios of 50 and 100, respectively. It will be observed from the figure that it is expected that higher magnetic permeability ferrites will impart this characteristic to the composite to a greater extent if incorporated into fibers having larger aspect ratios. In contrast, the use of a spherical particulate fill of high magnetic permeability imparts very little of this characteristic to the composite as a whole.

This effect has been verified experimentally by comparing a composite made with a powdered ferrite fill with a composite including sintered ferrite rods made of the same ferrite material. In the experiment, unsintered nickel zinc ferrite was dispersed in the epoxy matrix material at about a 10% volume concentration to make a first composite. The same nickel zinc ferrite powder was sintered into rods approximately ¼ inch in length and having an aspect ratio of about 50. An alternative method of making pure ceramic ferrite fibers is disclosed in U.S. Pat. No. 2,968,622 to Whitehurst, which is hereby incorporated by reference. The rods were placed at about a 10% volume concentration in the same epoxy matrix to make a second composite. Measurements of the magnetic permeability of the composites are tabulated below.

TABLE I

| Frequency | First (Powder) Composite Magnetic Permeability | Second (Rod) Composite Magnetic Permeability |
|---|---|---|
| 100 MHz | 1.3 | 1.8 |
| 1 GHz | 1.3 | 1.4 |
| 10 GHz | .9 | .9 |

The data indicates the effectiveness of the elongated ferrite configuration (i.e., rods having an aspect ratio on the order of 50) in the lower frequency regimes. As expected, the effect diminishes in high frequency regimes because of the decrease in intrinsic permeability of the nickel zinc ferrite used here.

Because of the inflexibility of the sintered rods and the difficulty of preparing them with very large aspect ratios, in many applications it may be desirable to employ, in their place, fibers made of ferrite filled polymer. Methods of producing ferromagnetic spinel fibers by spinning a composition comprising a fluid organic polymer medium and a particulate ferrite are disclosed in U.S. Pat. No. 4,541,973 to Arons, the contents of which are incorporated by reference herein.

The following examples are further illustrative of the preferred embodiments. The specific ingredients and processing parameters are presented as being typical and various modifications may be derived in view of the foregoing disclosure within the scope of the invention.

EXAMPLE 1

Figure 4:
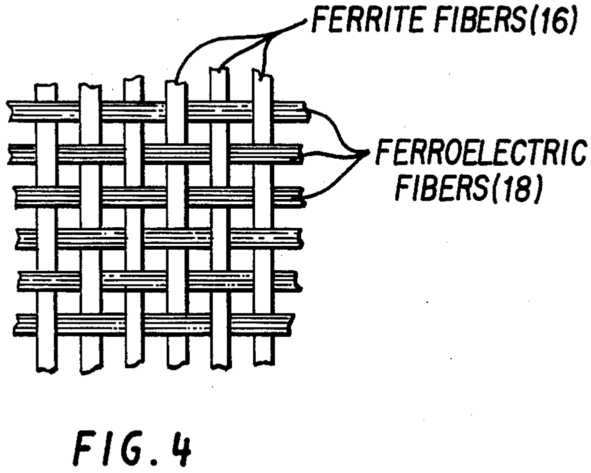
FIG. 4 is a pictorial diagram of a fabric woven from ferrite and ferroelectric fibers.

An oriented woven structure comprises a first polyvinylalcohol (PVA) fiber which contains 40 volume percent nickel ferrite particulates and a similar polyvinyl fiber filled with a non-magnetic dielectric fill, 40 volume percent particulate PZT (lead-zirconium titanate). The two fibers are woven into a fabric as shown if FIG. 4 so that the ferrite fibers (16) are approximately parallel to one another and approximately perpendicular to the ferroelectric fibers (18). The permeability of the ferrite particulates is 100 near 100 megahertz, and the permeability of the PVA fiber made therefrom is 10. The effective dielectric constant of the ferrite filled PVA is 20. The ferrite filled fibers take up 25% of the volume of the fabric. The PZT filled PVA fibers have an effective dielectric of 10. The PZT filled fibers are woven perpendicular to the ferrite filled fibers and take up 20% of the volume of the structure. The effective dielectric constant for this structure when the electric field is parallel to the PZT filled fibers is expected to be 3.252, while the effective permeability of the structure when the magnetic field is parallel to the ferrite filled fibers is expected to be 3.25. The impedance relative to free space is thus 0.9995, and the reflectivity for the above-described polarization is 0.00037 (or −68.7 decibels). The relative impedance of the ferrite filled fibers is 0.71, and a completely dense structure made from those fibers is expected to have a reflectivity of 0.17 (or −15.4 decibels). Thus, a significant reduction in the reflectivity is expected to be achieved by combining these fibers in an oriented structure with PZT filled fibers. It is important to note that since the ferrite filled material has a dielectric constant which is higher than its magnetic permeability, there is no way the reflectivity of the material could be reduced by adding dielectric material in an isotropic structure. Of course, the reduced reflectivity is observed for one linear polarization of incident radiation. The reflectivity for the opposite polarization is expected to be 0.35, i.e., higher than that which would be obtained from a similar isotropic material.

EXAMPLE 2

The same fibers are employed as in Example 1. However, they are not woven into a single oriented fabric, but are held in separate layers or sheets. All layers containing ferrite filled fibers are kept in one orientation, while all layers with PZT filled fibers are kept in another orientation.

Figure 5:
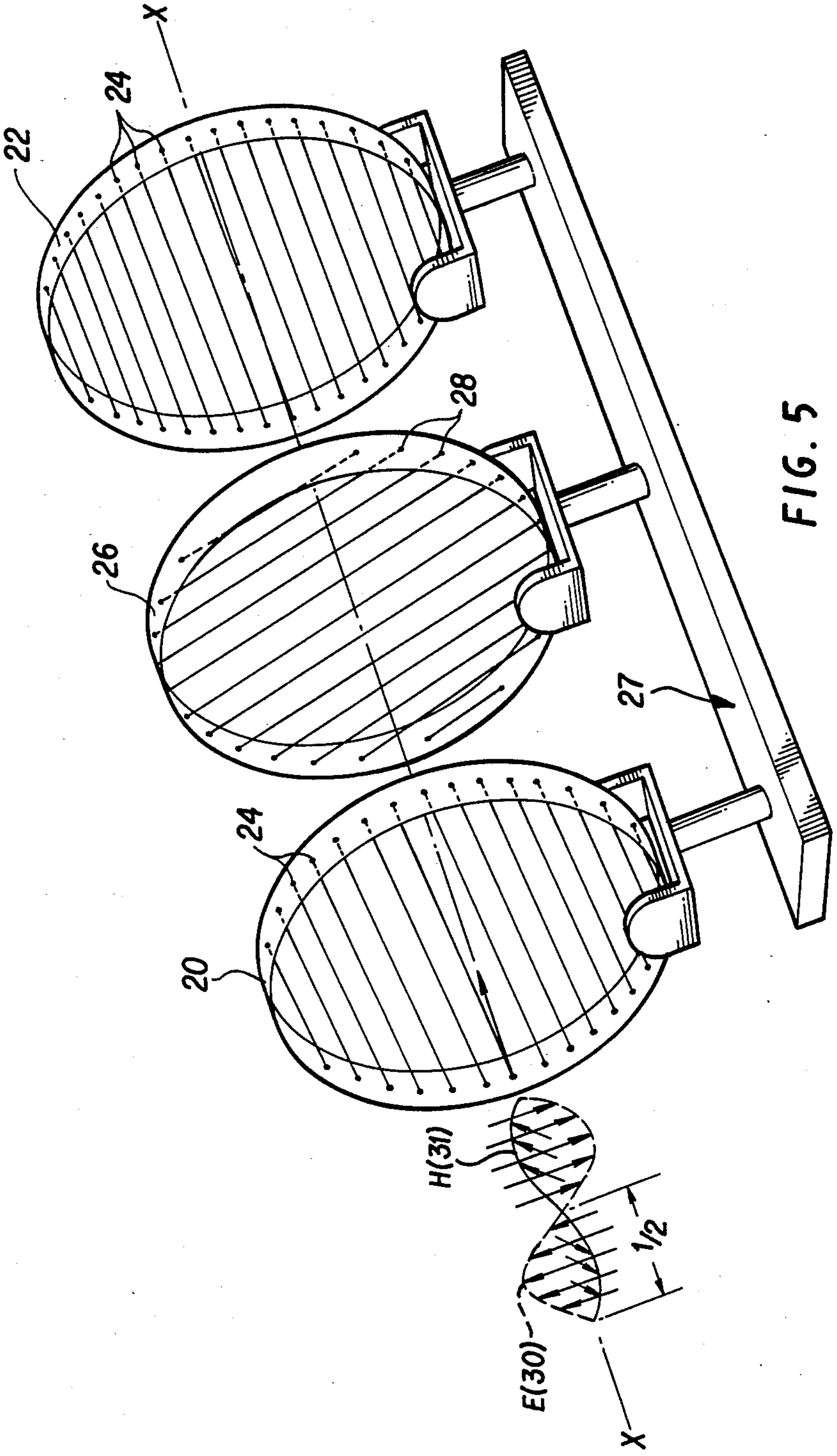
FIG. 5 is a pictorial diagram of a multilayer impedence matching device.

For example, as shown in FIG. 5, one or more sheets, such as sheets 20 and 22 containing ferrite fibers 24, may be provided, the fibers in the one or more sheets being oriented parallel to one another. One or more additional sheets such as sheet 26 may be provided containing ferroelectric fibers 28, oriented parallel to one another. The orientation of the two types of fibers can be changed by independently rotating the sheets. The structure for supporting and rotating the sheets may be similar to that of an air capacitor commonly found in radio and TV tuners. A structure for holding the sheets 22, 24 and 26 so that their principal planes are generally parallel to one another and so that the sheets may be rotated about an axis x—x is indicated at 27. In FIG. 5, the distances between the sheets is exagerated for clarity. In practice, the sheets may be disposed in sliding contact with one another.

The advantage of being able to adjust the relative orientation of the two types of fibers will be apparent: Changes in working frequency will lead to changes in the magnetic permeability of the ferrite filled material; and these changes can be compensated for by changing the angle between the fibers and the electric field 30 and/or magnetic field 31 of the incident radiation. For example, if the incident radiation increases in frequency from 100 MHZ to 200 MHZ, the permeability of the ferrite filled fibers will drop to 8, resulting in an effective permeability of 2.75 for a sheet having 25 volume percent of such fibers. If the ferroelectric sheet contains 20 volume percent of the ferroelectric fibers (as in Example 1), then it is expected that the decrease in permeability can be compensated for by rotating the sheet 26 about axis x—x so that the ferroelectric fibers lie at a 55 degree angle with respect to the electric field 30 Thus, this novel structure can be used to maintain very low reflectivity for polarized waves even when the material properties are changing with frequency. Other changes in material properties such as those due to temperature variations could also be compensated for by rotation of the oriented layers.

EXAMPLE 3

Ferrite filled PVA fiber with a permeability of 12 and a dielectric constant of 6 is mixed with PZT filled PVA fiber with a dielectric constant of 30 in a ratio of 7 ferrite filled fibers to 1 PZT filled fiber. The resulting yarn is then woven into an isotropic fabric (same structure in both warp and weave directions). This fabric will be impedance matched at all polarizations. If the ferrite filled fiber volume fraction is 50% (i.e., 25% for the fibers in each direction), then the effective permeability is expected to be 3.75, while the dielectric constant is expected to be 3.71, and the reflectivity will be 0.0054 (or −45 decibels). The reflectivity of the ferrite filled fibers without the PZT fibers is expected to be 0.17.

EXAMPLE 4

Chopped fibers with properties similar to those of Example 3 are put in a low density, low dielectric constant matrix. The addition of one part PZT filled fibers to the ferrite fiber filler again significantly reduces the reflectivity. The aspect ratio need only be above 20 for the theory described above to be useful in designing this impedance matched fabric.

The unoriented dispersion of high aspect ratio magnetic or dielectric material in a low dielectric constant matrix will raise the magnetic permeability and/or dielectric constant of the matrix by a larger amount than would be achieved if the same amount of similar material was added in powder form.

If one wants to increase the dielectric constant of a polymer, it is also well known that one can add a high dielectric constant filler material. Similarly, magnetic material can be added in order to increase the magnetic permeability of the polymer. The novel result is that one can obtain larger increases in the dielectric constant and/or magnetic permeability of a composite by using filler material in fiber form. This enhancement occurs below the percolation threshold for the fiber in the composite matrix and is due entirely to the reduction of demagnetization and depolarization effects when fibers are used.

Figure 6A:
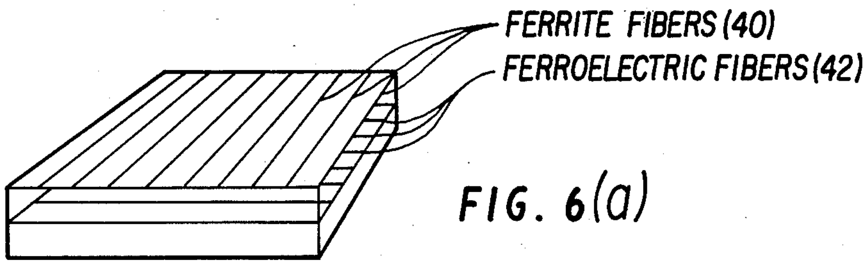
FIGS. 6 (*a*), (*b*), and (*c*) are examples of composites containing ferrite and ferroelectric fibers.
Figure 6B:
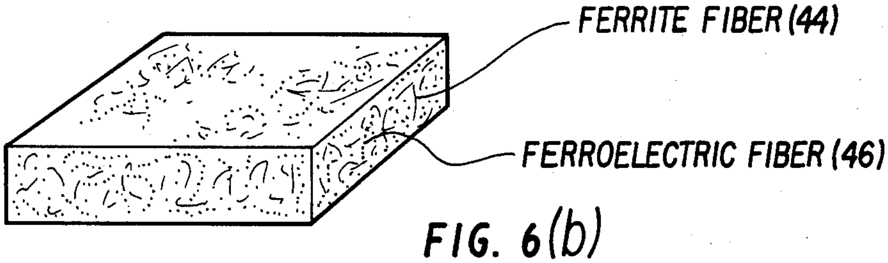
Figure 6C:
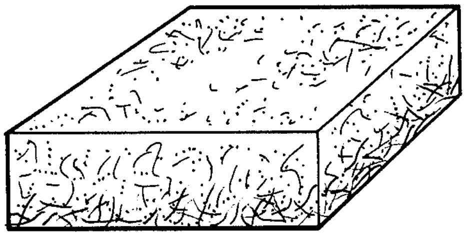

Examples of such structures are shown in FIGS. 6(*a*), 6(*b*) and 6(*c*). In FIG. 6(*a*), parallel ferrite fibers 40 in one orientation are composited with parallel ferroelectric 42 fibers in a perpendicular orientation. In FIG. 6(*b*), a composite is shown having a random dispersal of both ferrite fibers 44 and ferroelectric fibers 46. FIG. 6(*c*) illustrates a graded composite in which ferrite fibers and/or ferroelectric fibers are dispersed in a composite so that the fiber concentration is a function of the depth in the composite.

The disclosure indicates how selected values of magnetic permeability and/or selected dielectric constant can be achieved in oriented and unoriented fabrics or composites while minimizing the use of expensive magnetic and/or dielectric filler materials, whose addition, in large quantities to the composites or filaments, might otherwise degrade the mechanical, thermal or electrical properties of the resulting fabrics or composites. Moreover, the disclosure teaches novel impedance matched or tuneable sheet material containing ferrites which may be made from such fabrics and composites.

Although the invention has been described with preferred embodiments, it is to be understood that variations and modifications may be resorted to as will be apparent to those skilled in the art. Such variations and modifications are to be considered within the purview and the scope of the claims appended hereto.

What is claimed is:

1. A composite material having enhanced magnetic permeability comprising a non-magnetic matrix material and nonconducting fibers dispersed in said matrix material at a volume concentration less than 30% with respect to the matrix material, said fibers having an average aspect ratio of at least 20, said fibers having ferrite particulates therein at a concentration above the percolation threshold of said ferrite material in said fiber, and said fibers having longitudinal axes oriented randomly with respect to one another, so that the magnetic permeability of the composite is approximately proportional to the product of the magnetic permeability of the ferrite and the volume percent of ferrite material in the composite.

2. The composite of claim 1 wherein the volume percent and permeability of the ferrite are selected to minimize the reflectivity of the composite to incident electromagnetic radiation.

3. The composite of claim 2 wherein the magnetic permeability of the ferrite is between 10 and 100 in the frequency range of 100 MHz to 1000 MHz, and wherein the aspect ratio of the fibers is at least 50.

4. The composite of claim 1 wherein said fibers are sintered ferrite rods.

5. The composite of claim 1 wherein said fibers are less than 70 volume percent polymer and greater than 30 volume percent ferrite.

6. The composite of claim 5 wherein the polymer is selected from the group consisting of polyvinyl alcohol, polybenzimidazole and polyacrylonitrile.

7. The composite of claim 1 further comprising non-magnetic, dielectric fibers dispersed in said matrix.

8. A composite material having enhanced magnetic permeability comprising:

a non-magnetic matrix material; and non-conducting fibers dispersed in said matrix material at a volume concentration below a percolation threshold for said fibers in said matrix, said fibers having an aspect ratio of at least 50 and comprising: a polymer material and a particulate ferrite, wherein the volume percent of the particulate ferrite in said fiber is above a percolation threshold for said ferrite in said polymer.

9. A composite material having reduced reflectivity to electromagnetic radiation comprising:

a low density, low dielectric constant matrix;

chopped, ferrite filled fiber dispersed in said matrix, said fiber having a magnetic permeability greater than its dielectric constant; and chopped, non-magnetic, dielectric filled fiber dispersed in said matrix.

10. The composite material of claim 9 wherein the fibers are selected so that the dielectric constant of the composite is approximately equal to the magnetic permeability of the composite at a predetermined frequency of interest.

11. The composite material of claim 9 wherein said dielectric filled fibers comprise a polymer and lead-zirconium titanate (PZT), $PbZrTiO_4$.

12. The composite material of claim 9 wherein said ferrite filled fibers comprise a polymer and spinel particulates.

13. An absorber for polarized electromagnetic energy in a frequency range from about 10 megahertz to about 10 GHz, said energy being incident on the absorber from free air, said absorber comprising fibers at least a portion of which includes a ferrite, longitudinal axes of said fibers being generally parallel to one another, and wherein said fibers are generally aligned with the magnetic field of said polarized electromagnetic energy and wherein said fibers comprise a polymer and from 20 to 80 volume percent particulate ferrite fill.

14. The absorber of claim 13 wherein the fibers have an average aspect ratio of at least 50.

15. The absorber of claim 13 wherein the magnetic permeability of the fibers is greater than 4.

16. The absorber of claim 13 further comprising non-magnetic dielectric fibers having longitudinal axes aligned generally parallel to one another, and wherein said dielectric fibers are generally aligned with the electric field of said polarized electromagnetic energy.

17. The absorber of claim 16 wherein said dielectric fibers comprise a polymer and a particulate, high dielectric constant fill.

18. The absorber of claim 16 wherein the dielectric constant of the non-magnetic dielectric fiber is greater than 4.

19. The absorber of claim 13 wherein the effective dielectric constant of the absorber is approximately equal to the effective magnetic permeability of the absorber, for said polarized electromagnetic radiation.

20. An electromagnetic energy absorbing sheet material in which the dielectric constant presented to incident electromagnetic radiation is approximately equal to the magnetic permeability, comprising non-conducting fibers containing ferrite, said ferrite-containing fibers being oriented approximately parallel to one another, and non-conducting fibers containing a dielectric material, said dielectric material containing fibers oriented approximately parallel to one another.

21. The material of claim 20 wherein the ferrite fibers are oriented approximately perpendicular to the dielectric fibers.

22. The material of claim 20 wherein the ferrite fibers and dielectric fibers are composited with a polymer binder.

23. The material of claim 22 wherein the ferrite of said ferrite fibers is a spinel corresponding to the formula $$MFe_2O_4$$

wherein M is manganese, iron, cobalt, nickel, copper, zinc, cadmium, magnesium, barium, strontium or any combination thereof.

24. The material of claim 22 wherein the dielectric fibers comprise a polymer and a particulate dielectric fill comprising from 20 to 70 percent by volume of the fiber.

25. The material of claim 24 wherein the dielectric fill is a ferroelectric material such as lead-zirconium titanate (PZT), $PbZrTiO_4$.

* * * * *